(12) United States Patent
Jian et al.

(10) Patent No.: US 11,647,608 B2
(45) Date of Patent: May 9, 2023

(54) HEAT DISSIPATION APPARATUS AND SERVER

(71) Applicant: HUAWEI TECHNOLOGIES CO., LTD., Guangdong (CN)

(72) Inventors: Yiying Jian, Dongguan (CN); Dingfang Li, Dongguan (CN); Xinhu Gong, Shenzhen (CN); Gaoliang Xia, Dongguan (CN)

(73) Assignee: Huawei Technologies Co., Ltd., Shenzhen (CN)

(*) Notice: Subject to any disclaimer, the term of this patent is extended or adjusted under 35 U.S.C. 154(b) by 59 days.

(21) Appl. No.: 17/486,593

(22) Filed: Sep. 27, 2021

(65) Prior Publication Data

US 2022/0015268 A1 Jan. 13, 2022

Related U.S. Application Data

(63) Continuation of application No. PCT/CN2020/075164, filed on Feb. 14, 2020.

(30) Foreign Application Priority Data

Mar. 29, 2019 (CN) .......................... 201910248158.3

(51) Int. Cl.
*G06F 1/16* (2006.01)
*H05K 5/00* (2006.01)
(Continued)

(52) U.S. Cl.
CPC ..... *H05K 7/20418* (2013.01); *H05K 7/20718* (2013.01)

(58) Field of Classification Search
CPC .......... H05K 7/20418; H05K 7/20718; H05K 7/20409; H05K 7/2039; H05K 7/20709
See application file for complete search history.

(56) References Cited

U.S. PATENT DOCUMENTS 9,218,020 B1   12/2015 Martinez et al.
2003/0210528 A1* 11/2003 Huang ................ H01L 23/4093
                                                         361/709

(Continued)

FOREIGN PATENT DOCUMENTS

CN   101267723 A   9/2008
CN   201853169 U   6/2011
(Continued)

OTHER PUBLICATIONS

Office Action issued in Chinese Application No. 201910248158.3 dated Mar. 1, 2021, 6 pages (with English translation).

(Continued)

Primary Examiner — Anthony M Haughton
(74) Attorney, Agent, or Firm — Fish & Richardson P.C.

(57) ABSTRACT

The present disclosure relates to heat dissipation apparatus. One example heat dissipation apparatus includes a heat dissipation assembly and a bracket assembly, where the heat dissipation assembly is configured to dissipate heat for a server chip and includes a substrate and a heat sink, the heat dissipation assembly is connected to the bracket assembly, the bracket assembly includes a bracket and a plurality of first elastic structural members that are disposed on the bracket, each first elastic structural member includes a supporting portion and a connection portion, and at least one hook is disposed on the connection portion.

20 Claims, 8 Drawing Sheets

(51) Int. Cl.
  *H05K 7/00*   (2006.01)
  *H05K 7/20*   (2006.01)

(56) References Cited

U.S. PATENT DOCUMENTS

| | | | | |
|---|---|---|---|---|
| 2003/0227749 | A1* | 12/2003 | Li | H01L 23/467 |
| | | | | 257/E23.099 |
| 2007/0058345 | A1* | 3/2007 | Yu | H01L 23/467 |
| | | | | 257/E23.099 |
| 2007/0121301 | A1* | 5/2007 | Tan | H01L 23/4093 |
| | | | | 257/E23.099 |
| 2008/0174967 | A1* | 7/2008 | Chang | F04D 29/668 |
| | | | | 361/719 |
| 2009/0135552 | A1 | 5/2009 | Tu et al. | |
| 2010/0172103 | A1* | 7/2010 | Du | H01L 23/4093 |
| | | | | 361/710 |
| 2012/0138263 | A1* | 6/2012 | Tang | F04D 29/601 |
| | | | | 165/80.2 |
| 2014/0111933 | A1 | 4/2014 | Knopf et al. | |
| 2015/0008473 | A1* | 1/2015 | Lee | F21V 17/002 |
| | | | | 257/99 |

FOREIGN PATENT DOCUMENTS

| | | |
|---|---|---|
| CN | 201853688 U | 6/2011 |
| CN | 105280589 A | 1/2016 |
| CN | 206322100 U | 7/2017 |
| CN | 206759656 U | 12/2017 |
| CN | 108710409 A | 10/2018 |
| CN | 110045803 A | 7/2019 |

OTHER PUBLICATIONS

Office Action issued in Chinese Application No. 201910248158.3 dated Jun. 22, 2020, 12 pages (with English translation).
PCT International Search Report and Written Opinion issued in International Application No. PCT/CN2020/075164 dated May 13, 2020, 18 pages (with English translation).

* cited by examiner

HEAT DISSIPATION APPARATUS AND SERVER

CROSS-REFERENCE TO RELATED APPLICATIONS

This application is a continuation of International Application No. PCT/CN2020/075164, filed on Feb. 14, 2020 which claims priority to Chinese Patent Application No. 201910248158.3, filed on Mar. 29, 2019. The disclosures of the aforementioned applications are hereby incorporated by reference in their entireties.

TECHNICAL FIELD

This application relates to the field of servers, and in particular, to a heat dissipation apparatus and a server.

BACKGROUND

The era of the Internet, big data, and cloud computing imposes higher requirements on transmission and processing speeds, storage capabilities, and high-performance computing capabilities of massive data. A server chip generates a large amount of heat during intensive computing. If the chip is overheated, a processing capability is reduced or even the chip is damaged.

To dissipate heat for the chip, the chip is usually fastened with a heat sink by using a clamping piece, and then the foregoing structure is fastened on a printed circuit board (PCB) by using a bracket. The clamping piece is configured to limit positions of the heat sink and the chip, and the chip is mounted on the PCB by using a chip socket. To prevent the chip and the heat sink from being displaced in a transportation process and affecting heat dissipation for the chip, after the chip is fastened with the heat sink, the chip and the heat sink are usually fastened on the bracket by using a fastener (for example, a screw or a nut). However, to increase a processing capability of each chip, in most design solutions, more components and circuit structures are disposed on a same chip. As a result, a size of the chip increases. To dissipate heat for the chip, a size of a heat sink adapted to the chip also gradually increases. In this case, when the chip and the heat sink are fastened on the bracket, the bracket needs to bear larger pressure. In addition, the chip is connected to the chip socket by using a pin. In a mounting and detaching process, relatively large pressure generated by the foregoing fastener easily causes the heat sink to incline, resulting in a problem that the pin of the chip is crooked when the pin of the chip is inserted into the chip socket, and the chip is damaged. In addition, the pin of the chip may alternatively be soldered on the PCB. In this case, the heat sink also needs to be pressed on a surface of the chip by using a fastener, to dissipate heat for the chip. In a process of mounting and detaching the heat sink, relatively large pressure generated by the fastener also easily causes the heat sink to incline. Further, a relatively large local instantaneous force is applied to the chip, causing damage to the chip. Therefore, how to provide a heat dissipation apparatus that can effectively dissipate heat for the chip and that is easy to maintain becomes a technical problem that needs to be urgently resolved.

SUMMARY

This application provides a heat dissipation apparatus and a server, to implement effective heat dissipation for a chip and facilitate maintenance.

According to a first aspect, this application provides a heat dissipation apparatus. The heat dissipation apparatus includes a heat dissipation assembly and a bracket assembly. The heat dissipation assembly is configured to dissipate heat for a chip, and includes a substrate and a heat sink. In addition, the heat dissipation assembly is connected to the bracket assembly by using the substrate. The bracket assembly includes a bracket and a plurality of first elastic structural members disposed on the bracket. The first elastic structural member includes a supporting portion and a connection portion. At least one hook is disposed on the connection portion. In this way, when the heat dissipation assembly is fastened on the bracket assembly, the connection portion may be clamped with the heat dissipation assembly by using the at least one hook, to fasten the heat dissipation assembly. The supporting portion generates an upward buoyant force under an effect of gravity of the heat dissipation assembly, to support the heat dissipation assembly. Effective heat dissipation for the chip can be implemented by using the heat dissipation apparatus of this application. In addition, when the heat dissipation assembly is fastened on the bracket assembly, due to a supporting effect of the supporting portion, the heat dissipation assembly can be effectively prevented from generating relatively large inclination. This facilitates maintenance and can avoid damaging the chip.

In a possible implementation, when the bracket assembly is specifically disposed, the bracket assembly may include one bracket or two brackets. When the bracket assembly includes one bracket, a PCB that performs signal transmission with the chip is fastened to a side of the bracket that is away from the first elastic structural member by using a screw or in a bonding manner. When the bracket assembly includes two brackets, the PCB that performs signal transmission with the chip is disposed between the two brackets, the first elastic structural member is disposed on a bracket connected to the heat dissipation assembly, and the two brackets may be connected by using a fastener such as a screw.

In a possible implementation, there are a plurality of first elastic structural members. There may be many specific manners of disposing the first elastic structural member on the bracket. For example, the first elastic structural member is disposed perpendicular to an edge of a frame body of the bracket, and is disposed at a middle point or any position of the frame body of the bracket.

In a possible implementation, the bracket includes a rectangular frame body enclosed by a plurality of frame edges. There are two first elastic structural components, which are separately disposed at vertexes of intersections between a diagonal of the rectangular frame body and the rectangular frame body. In addition, the connection portion of the first elastic structural member is disposed on an edge of the rectangular frame body, and the hook of the connection portion may be clamped with an edge portion of the substrate of the heat dissipation assembly. In this way, an area of contact between the hook and the heat dissipation assembly is small to the greatest extent, so that an effective heat dissipation area of the heat dissipation assembly is relatively large, and heat dissipation performance is relatively good. In another possible implementation, a clamping slot may alternatively be provided on the substrate. In this way, a position at which the first elastic structural member is disposed is more flexible, provided that the hook can match and be clamped with the clamping slot.

In a possible implementation, to implement a connection between the hook and the heat dissipation assembly, a clamping surface on which the hook is clamped with the heat dissipation assembly may be set to a step-shaped horizontal plane or oblique plane. Further, an anti-slip structure, for example, patterns of different shapes, or a rubber pad may also be disposed on the clamping surface that is horizontally disposed or obliquely disposed, to enable clamping between the hook and the heat dissipation assembly to be more reliable.

In a possible implementation, there may be many manners of disposing the connection portion and the supporting portion of the first elastic structural member. In a possible implementation, the supporting portion is of a cantilever beam structure with an end fastened to the connection portion. The supporting portion is configured to provide an upward supporting force for the heat dissipation assembly by using the cantilever beam structure. In addition, to implement effective support for the heat dissipation assembly by the supporting portion, the supporting force may be enabled to be greater than or equal to gravity generated by an area of contact between the heat dissipation assembly and the supporting portion. In this way, when the heat dissipation assembly is detached from the bracket assembly, the heat dissipation assembly may be enabled to detach from the hook under the supporting effect of the supporting portion. In addition, the first elastic structural member may be of an integral structure, to simplify a structure of the first elastic structural member. In addition, the first elastic structural member may be made of a material with relatively good elasticity and relatively strong structural stability, such as plastic or a steel sheet.

In a possible implementation, to increase reliability of a connection between the heat dissipation assembly and the bracket assembly, and prevent the chip and the heat sink from being displaced in processes such as transportation and packaging of a server and affecting heat dissipation for the chip, in a specific implementation, the heat dissipation apparatus further includes a second elastic structural member. A first mounting hole is provided in the substrate. A second mounting hole in one-to-one correspondence with the first mounting hole is provided in the bracket. After the heat dissipation assembly is mounted into the bracket assembly, the second elastic structural member may be enabled to sequentially pass through the first mounting hole and the second mounting hole, to fasten the heat dissipation assembly with the bracket assembly.

In a possible implementation, when the second elastic structural member is specifically disposed, the second elastic structural member may include a screw and a spring sleeved over the screw. In this case, the first mounting hole may be a through hole or a threaded hole, and the second mounting hole is a threaded hole, so that the screw can be fastened to the second mounting hole after passing through the first mounting hole. In this way, the connection between the heat dissipation assembly and the bracket assembly is enabled to be more reliable.

In a possible implementation, when the heat dissipation apparatus is configured to dissipate heat for the server chip, the chip may be disposed on the heat dissipation assembly, or may be disposed on the bracket assembly. When the chip is disposed on the bracket assembly, the chip is fastened on the PCB in manners such as soldering. In this case, the second elastic structural member may be adjusted to make the heat dissipation assembly come into contact with the chip, thereby dissipating heat for the chip. In an implementation in which the chip is directly fastened on the PCB, when the heat dissipation assembly is fastened on the bracket assembly, due to the supporting effect of the supporting portion, in a process of fastening the second elastic structural member and when the server is in a dynamic scenario such as packaging and transportation, the heat dissipation assembly can be effectively prevented from generating relatively large inclination, thereby avoiding damaging the chip.

In a possible implementation, the chip is disposed on the heat dissipation assembly. This differs from a setting manner in which the chip is directly fastened on the PCB in that, the chip is fastened to a side of the substrate that is away from the heat sink by using a clamping piece, and a pin of the chip may be plug-connected to a chip socket of the PCB. In this way, an acting force applied by the heat dissipation assembly to the chip may be adjusted by using the second elastic structural member, to enable good contact between the chip and the chip socket. In this implementation, when the heat dissipation assembly is fastened on the bracket assembly, in a process of fastening the second elastic structural member and when the server is in a dynamic scenario such as packaging and transportation, due to the supporting effect of the supporting portion, the heat dissipation assembly can be effectively prevented from generating relatively large inclination, thereby avoiding damaging the chip.

In a possible implementation, to further adapt to chips with different thicknesses, when the clamping piece is specifically disposed, a supporting structure may be disposed on a side of the clamping piece that is away from the heat dissipation assembly. The supporting structure may move along a direction perpendicular to the clamping piece. When a length of extension of the supporting structure out of the clamping piece is equal to a thickness of the chip, the supporting structure stops moving. In this way, chips with different thicknesses can be clamped with clamping surfaces under corresponding steps, so that the heat dissipation apparatus applies an acting force that satisfies a plug-connection requirement for the chips with different thicknesses, thereby broadening an application scope of the heat dissipation apparatus.

According to a second aspect, some embodiments of this application further provide a server. The server includes a chip, and the heat dissipation apparatus according to the first aspect and any possible implementation of the first aspect. The heat dissipation assembly of the heat dissipation apparatus is configured to dissipate heat for the chip. The heat dissipation apparatus can enable the chip to have good heat dissipation performance. In addition, in a process in which the heat dissipation assembly is mounted with the bracket assembly, the connection portion of the first elastic structural member may fasten the heat dissipation assembly. Moreover, the supporting portion may provide an upward supporting force for the heat dissipation apparatus. In this way, a force loaded by the heat dissipation assembly to the chip can be effectively prevented from being excessively large, thereby avoiding damaging the chip.

DESCRIPTION OF EMBODIMENTS

To facilitate understanding of a heat dissipation apparatus provided in some embodiments of this application, the following first describes an application scenario of the heat dissipation apparatus provided in some embodiments of this application. The heat dissipation apparatus is configured to dissipate heat for a server that has a high power and that generates a relatively large amount of heat, and is configured to dissipate heat mainly for a server chip. The server chip may be a bare chip or a non-bare chip, but is not limited to the foregoing two types. A chip that needs to be protected by a protective cover plate is referred to as a non-bare chip, and a chip that does not need to be protected by a protective cover plate is referred to as a bare chip. The chip includes a central processing unit (CPU), artificial intelligence (AI) chip, a system on chip (SoC), and another chip that has a high power and that needs separate heat dissipation. Connecting manners of the bare chip and the non-bare chip are similar to those of a heat sink and a bracket. For ease of description, the following description in some embodiments of this application uses a bare chip that is a central processing unit as an example for description. The following describes the heat dissipation apparatus in detail with reference to the accompanying drawings.

Figure 6:
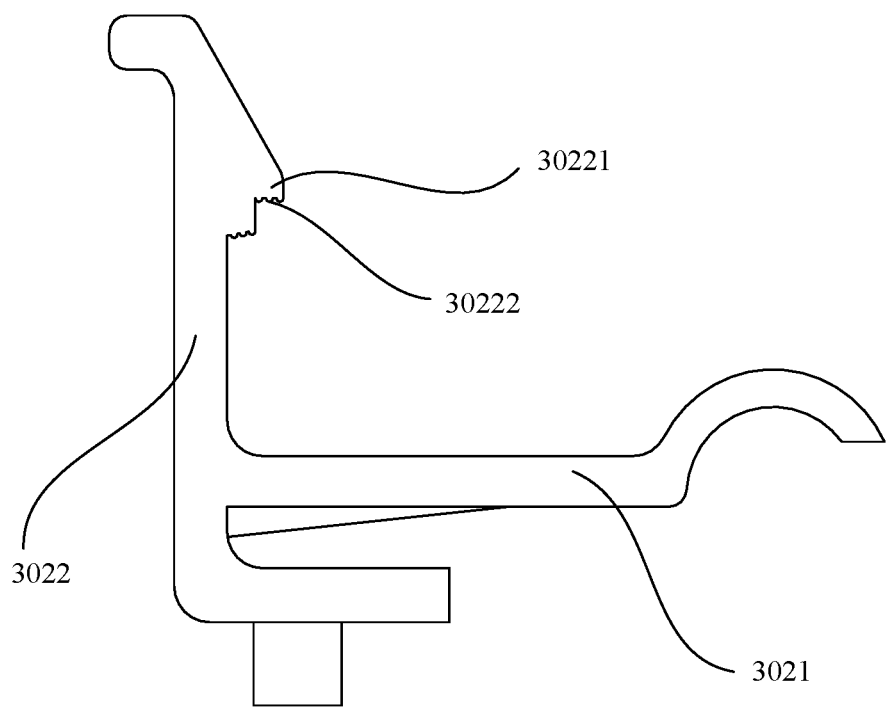
FIG. 6 is a schematic structural diagram of a first elastic structural member according to an embodiment of this application.
Figure 7:
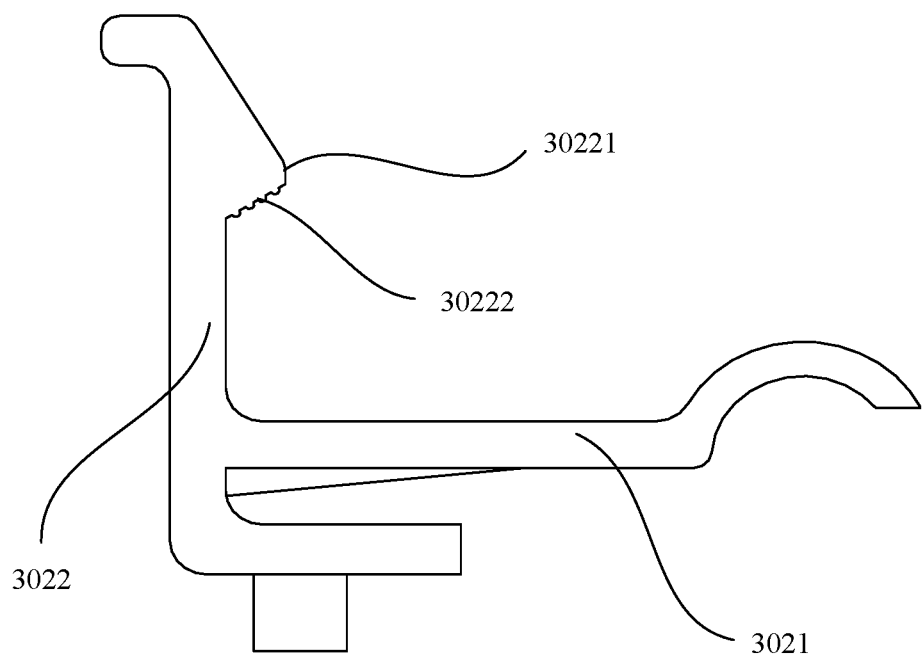
FIG. 7 is a schematic structural diagram of another first elastic structural member according to an embodiment of this application.

Refer to FIG. 1 to FIG. 3, FIG. 10, and FIG. 11. Some embodiments of this application provide a heat dissipation apparatus 1. The heat dissipation apparatus 1 includes a heat dissipation assembly 2 and a bracket assembly 3 in a detachable connection to each other. The bracket assembly 3 may be fastened to a PCB 6 of a server by using a fastener, or may be directly bonded to the PCB 6 of the server. The bracket assembly 3 includes a bracket 301. A plurality of first elastic structural members 302 are disposed on a side of the bracket 301 facing toward the heat dissipation assembly 2. Each of the first elastic structural members 302 may be disposed perpendicular to a frame body of the bracket 301, and is configured to fasten and support the heat dissipation assembly 2 when the heat dissipation assembly 2 is mounted with the bracket assembly 3. Specifically, the first elastic structural member 302 includes a supporting portion 3021 and a connection portion 3022 that are connected to each other. Refer to FIG. 6 and FIG. 7. A hook 30221 is disposed on the connection portion 3022. In this way, when the heat dissipation assembly 2 is mounted with the bracket assembly 3, the bracket assembly 3 may be enabled to be clamped with the heat dissipation assembly 2 by using the hook 30221. In this case, because the supporting portion 3021 is made of an elastic material, when the heat dissipation assembly 2 is clamped on the bracket assembly 3, the supporting portion 3021 generates an upward rebound force under an effect of gravity of the heat dissipation assembly 2, to support the heat dissipation assembly 2.

Figure 1:
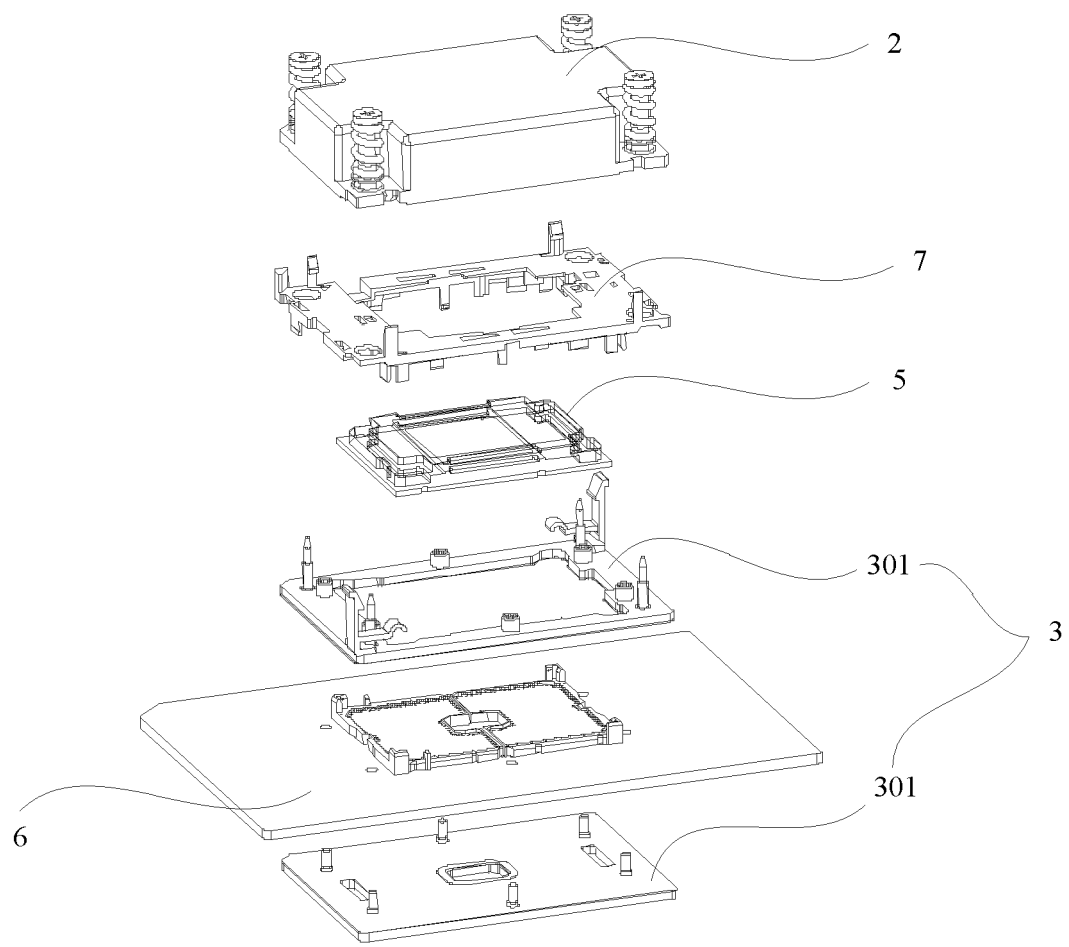
FIG. 1 is an exploded view of a heat dissipation apparatus according to an embodiment of this application.
Figure 3:
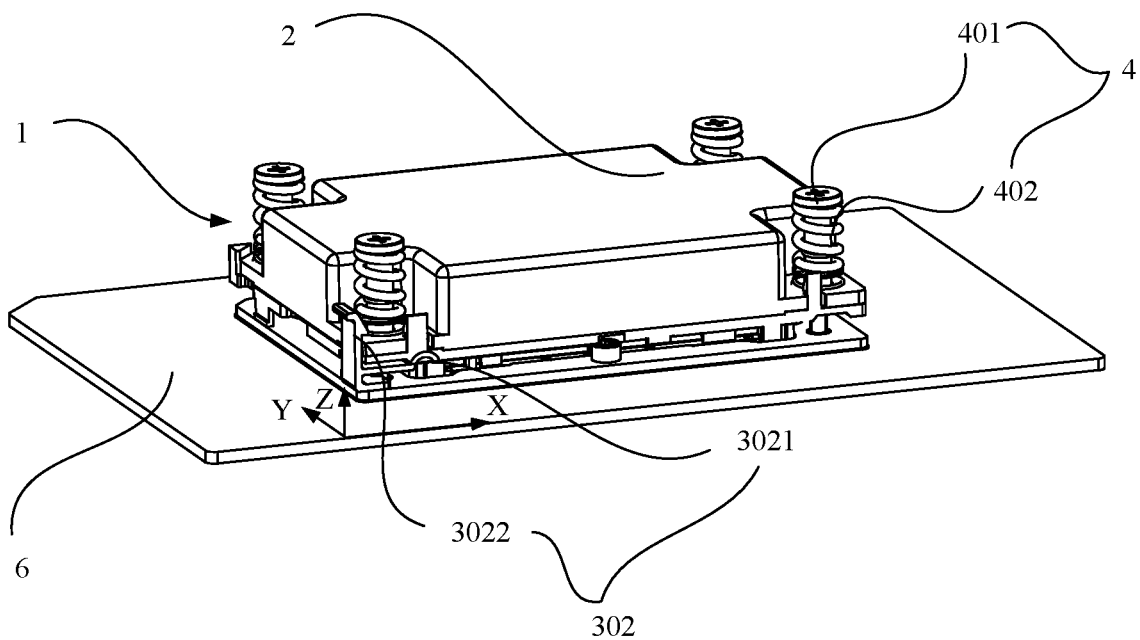
FIG. 3 is a front schematic structural diagram of a heat dissipation apparatus according to an embodiment of this application.
Figure 4:
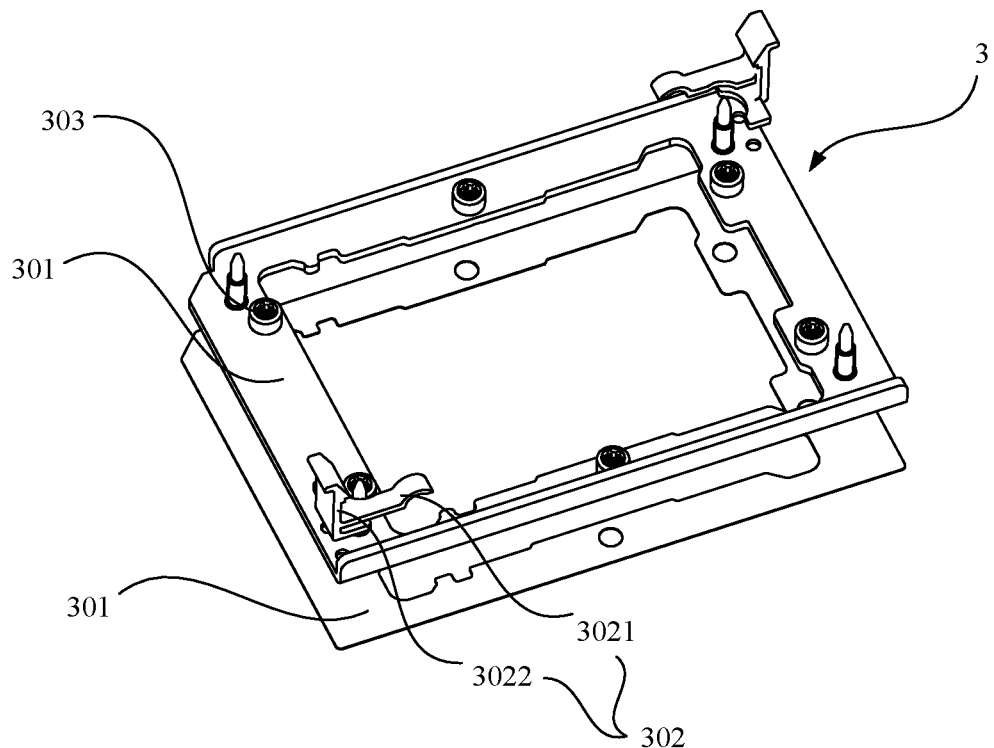
FIG. 4 is a top schematic structural diagram of a bracket assembly according to an embodiment of this application.
Figure 5:
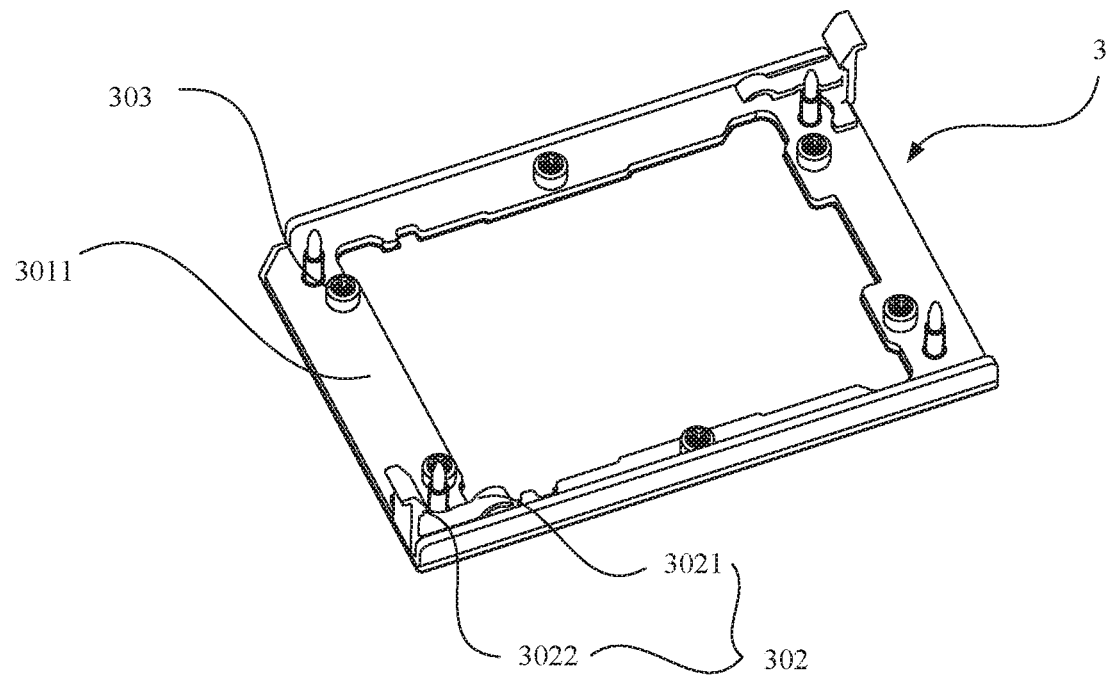
FIG. 5 is a top schematic structural diagram of another bracket assembly according to an embodiment of this application.

Refer to FIG. 1, FIG. 2, FIG. 4, FIG. 5, and FIG. 11. When the bracket assembly 3 is specifically disposed, the bracket assembly 3 includes one bracket 301 or two brackets 301. As shown in FIG. 1 to FIG. 3, and FIG. 5, FIG. 5 is a schematic structural diagram of the bracket assembly 3 including only one bracket 301. In a specific implementation of this application, description is provided by using an example in which the bracket assembly 3 includes one bracket 301, and the bracket 301 is sequentially enclosed by a plurality of frame edges 3011. The first elastic structural member 302 is disposed at a position perpendicular to an edge of a square frame body formed by the bracket 301, including a position perpendicular to an edge of the square frame body shown in FIG. 1, and any position in an edge of the square frame body (for example, a position of a middle point of an edge). Two or more first elastic structural members 302 may be disposed in a same heat dissipation apparatus. For example, as shown in FIG. 1, FIG. 4, and FIG. 5, a first elastic structural member 302 is disposed at each position of vertexes of intersections between a diagonal of the bracket 301 and the frame body. Specifically, a first elastic structural member 302 may be disposed at each vertex of intersections between a diagonal and the frame body, or a first elastic structural member 302 may be disposed at each vertex of intersections between diagonals and the frame body. Alternatively, a first elastic structural member 302 is disposed on each opposite edge. Specifically, the first elastic structural member 302 may be disposed at a middle point or any position of the edge. However, a connecting line of positions of the first elastic structural members 302 disposed on two edges is parallel to two other edges of the frame body of the bracket 301. Alternatively, four first elastic structural members 302 are separately disposed at four right angle positions of the frame body of the bracket 301. The bracket 301 may be of a structure that is integrally formed, and the bracket 301 may be made of a metal material such as aluminum, iron, or an alloy.

Refer to a setting manner in FIG. 1, FIG. 4, and FIG. 5. Two first elastic structural members 302 are included, and are separately disposed at vertexes of intersections between a diagonal of the bracket 301 and the frame body. The connection portion 3022 and the supporting portion 3021 of the first elastic structural member 302 are disposed along an extending direction of a frame edge 3011. Specifically, the connection portion 3022 may be disposed on an edge of the frame edge 3011. In this case, the hook 30221 of the connection portion 3022 may be clamped with an edge portion of the heat dissipation assembly 2. In this way, a connection between the connection portion 3022 and the heat dissipation assembly 2 does not occupy a heat dissipation region of the heat dissipation assembly 2, to enable heat dissipation performance of the heat dissipation assembly 2 to be relatively good. In addition, a clamping slot that can be clamped with the hook 30221 may alternatively be provided on the heat dissipation assembly 2. In this case, the connection portion 3022 only needs to be disposed opposite to the clamping slot. In this way, a process setting requirement of the first elastic structural member 302 may also be effectively reduced. The connection portion 3022 and the supporting portion 3021 may be of a structure that is integrally formed, to facilitate processing the first elastic structural member 302. In addition, the first elastic structural member 302 may be made of a material with relatively good elasticity and relatively strong structural stability, such as plastic or a steel sheet.

Refer to FIG. 4 and FIG. 5. When the supporting portion 3021 is specifically disposed, the supporting portion 3021 is of a cantilever beam structure with an end fastened to the connection portion 3022. The supporting portion 3021 of the structure may generate relatively large deformation under an effect of gravity of the heat dissipation assembly 2, to further provide an upward force, thereby providing a relatively large reverse supporting force for the heat dissipation assembly 2. The cantilever beam structure of the supporting portion 3021 may include one or more arch structures, so that the cantilever beam structure can provide a supporting force greater than or equal to gravity generated by an area of contact between the heat dissipation assembly 2 and the supporting portion 3021. When the heat dissipation assembly 2 is fastened downwardly on the bracket 301, the cantilever beam structure may provide an upward supporting force. In a possible implementation, the supporting portion 3021 may alternatively be in direct contact with the bracket assembly 3, provided that the supporting portion 3021 can elastically support the heat dissipation assembly 2. Specific setting manners of the supporting portion 3021 are not listed one by one herein.

Figure 10:
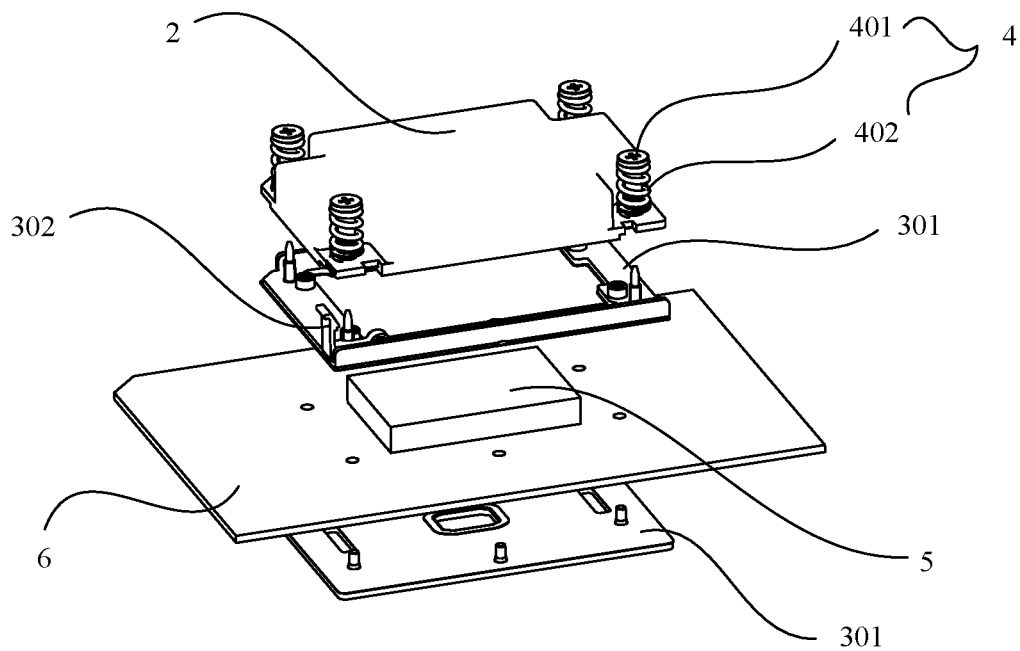
FIG. 10 is an exploded view of another heat dissipation apparatus according to an embodiment of this application.

Refer to FIG. 1, FIG. 4, and FIG. 10. When the bracket assembly 3 includes two brackets 301, for ease of description, the bracket 301 configured to connect to the heat dissipation assembly 2 is referred to as a first bracket, and the bracket 301 configured to connect to the server is referred to as a second bracket. In this case, the first bracket and the second bracket may be connected by using a fastener such as a screw. Specifically, threaded holes may be separately disposed at corresponding positions of the first bracket and the second bracket, so that the screw sequentially passes through the two threaded holes for fastening.

Figure 2:
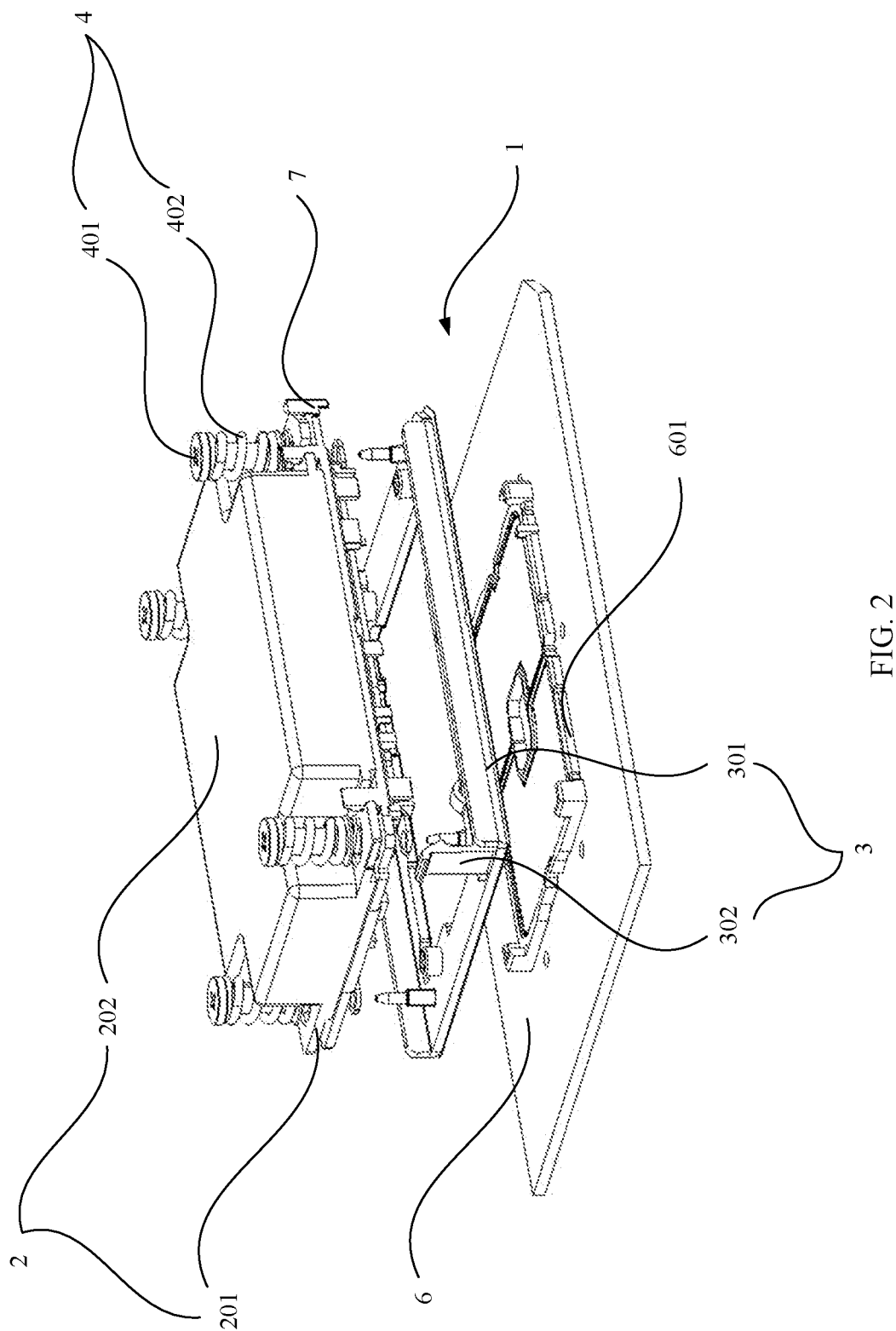
FIG. 2 is a schematic structural diagram of a heat dissipation apparatus according to an embodiment of this application.

Refer to FIG. 1 to FIG. 3. When the heat dissipation assembly 2 is specifically disposed, the heat dissipation assembly 2 includes a substrate 201, and a heat sink 202 disposed on the substrate 201. The heat dissipation assembly 2 is connected to the bracket assembly 3 by using the substrate 201. The heat dissipation apparatus 1 may further include a second elastic structural member 4. A first mounting hole (not shown in the figure) is provided in the substrate 201. There may be a plurality of first mounting holes. The plurality of first mounting holes may be provided at any position of the substrate. Refer to FIG. 1. In a possible embodiment, there are four first mounting holes, and the four first mounting holes are separately disposed at four corners of the substrate. Refer to FIG. 6 and FIG. 7. In addition, a second mounting hole 303 opposite to the first mounting hole is provided in the bracket assembly 3. In this way, after the heat dissipation assembly 2 is clamped into the bracket assembly 3, the elastic structural member may be fastened between the heat dissipation assembly 2 and the bracket assembly 3 by using the second elastic structural member 4 that sequentially passes through the first mounting hole and the second mounting hole 303. As shown in FIG. 1 to FIG. 3, FIG. 10, and FIG. 11, when the second elastic structural member 4 is specifically disposed, the second elastic structural member 4 may include a screw 401, and a spring 402 sleeved over the screw 401. Moreover, the first mounting hole may be a through hole or a threaded hole. The second mounting hole 303 is a threaded hole. In this way, magnitude of a fastening force between the heat dissipation assembly 2 and the bracket assembly 3 may be adjusted by using the second elastic structural member 4. The adjusting manner is relatively simple, and can enable the connection to be relatively reliable.

The heat dissipation apparatus 1 of this application may be configured to dissipate heat for the server, and mainly dissipates heat for a chip 5 of the server. The chip 5 may be first fastened with the heat dissipation assembly 2, and then fastened on the PCB, or may be directly fastened on the PCB. The PCB 6 of the server is fastened to a side of the bracket 301 that is away from the first elastic structural member 302. The chip 5 may perform signal transmission with the PCB 6. For example, the chip 5 performs signal transmission with the PCB 6 by using a chip socket on the PCB 6. As shown in FIG. 1 to FIG. 3, when the chip 5 is first fastened with the heat dissipation assembly 2, the heat dissipation assembly 2 further includes a clamping piece 7. The chip 5 is fastened to a side of the substrate 201 that is away from the heat sink 202 by using the clamping piece 7. The chip socket 601 that matches and that is plug-connected to the chip 5 is disposed on the PCB 6. The chip socket 601 may be fastened on the PCB 6 in manners such as soldering. When the heat dissipation assembly 2 is mounted into the bracket assembly 3, the fastening force between the heat dissipation assembly 2 and the bracket assembly 3 may be adjusted by using the second elastic structural member 4, to apply a load force for the chip 5 for plug connection between the chip 5 and the chip socket 601, to implement good contact between the chip 5 and the chip socket 601. In addition, as shown in FIG. 3, when the heat dissipation assembly 2 is assembled with the bracket assembly 3, the supporting portion 3021 of the first elastic structural member 302 provides a supporting force along a Z direction (the Z direction is a direction in which the heat dissipation assembly moves away from the supporting portion) for the heat dissipation assembly 2. Therefore, when the second elastic structural member 4 is fastened, the heat dissipation assembly 2 can be effectively prevented from generating relatively large inclination, to prevent the chip socket 601 from bearing a relatively large instantaneous force, thereby avoiding damaging the chip socket 601. Moreover, when the server experiences a dynamic scenario such as falling or impact, a beating force of the heat dissipation assembly 2 on the chip socket 601 can be effectively alleviated.

The first elastic structural member 302 is disposed on the bracket assembly 3, so that when the heat dissipation assembly 2 is mounted with the bracket assembly 3, the hook 30221 of the connection portion 3022 of the first elastic structural member 302 is clamped with the heat dissipation assembly 2. Moreover, the supporting portion 3021 of the first elastic structural member 302 is compressed under gravity of the heat dissipation assembly 2, to generate a supporting buoyant force for the heat dissipation assembly 2. In this way, when the heat dissipation assembly 2 is fastened on the bracket assembly 3 by using the second elastic structural member 4, the heat dissipation assembly 2 can be effectively prevented from generating relatively large inclination, thereby avoiding causing a problem that a pin of the chip 5 is inverted in a process in which the pin of the chip 5 is inserted into the chip socket 601. When the heat dissipation assembly 2 is detached from the bracket assembly 3, the heat dissipation assembly 2 may detach from the hook 30221 under an effect of the supporting portion 3021 after clamping between the hook 30221 and the heat dissipation assembly 2 is manually unlocked.

Refer to FIG. 6 and FIG. 7. In a possible implementation, to adapt to structures of chips with different thicknesses, the hook 30221 of the connection portion 3022 of the first elastic structural member 302 has a clamping surface 30222 clamped with the heat dissipation assembly 2. The clamping surface 30222 is a step-shaped horizontal plane or oblique plane. In addition, an anti-slip structure, for example, different patterns may be disposed on the step-shaped horizontal plane or oblique plane, to increase friction between the clamping surface 30222 and the heat dissipation assembly 2, thereby enabling the connection between the heat dissipation assembly 2 and the bracket assembly 3 to be more reliable.

Figure 8:
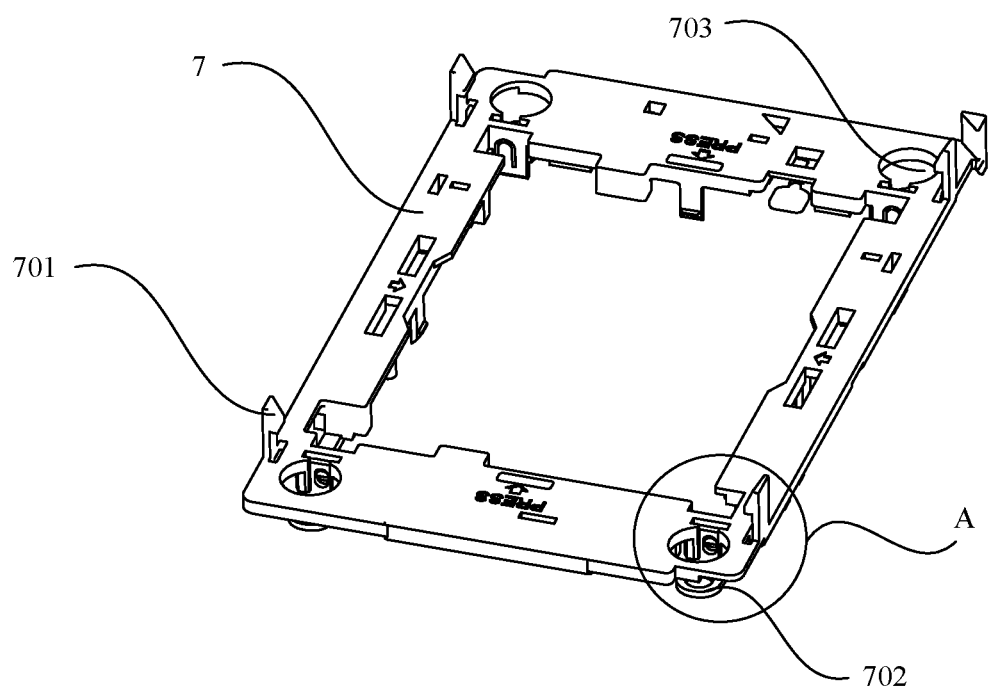
FIG. 8 is a schematic structural diagram of a clamping piece according to an embodiment of this application.
Figure 9:
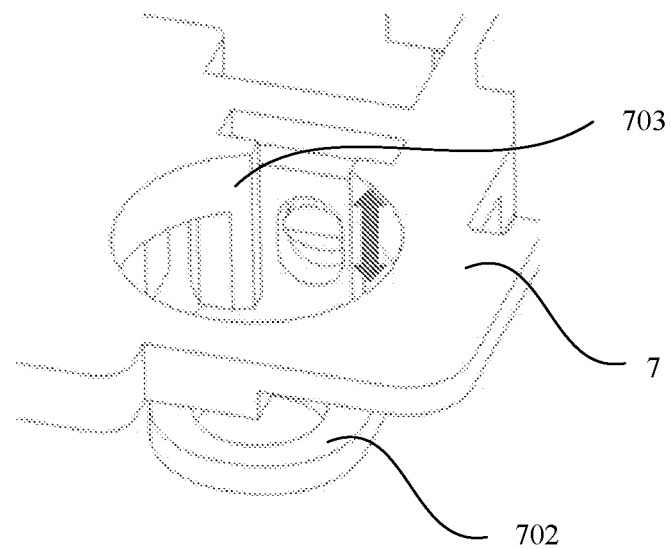
FIG. 9 is an enlarged view of a local structure of A in FIG. 8.

Further, to match the clamping surface 30222 that is set to the step-shaped horizontal plane or oblique plane, so that a same heat dissipation apparatus adapts to chips 5 with different thicknesses. Refer to FIG. 8 and FIG. 9. When the clamping piece 7 is specifically disposed, a supporting structure 702 may be disposed on the clamping piece 7. The supporting structure 702 is in a slidable connection to the clamping piece 7. In other words, the supporting structure 702 can move along a direction perpendicular to the clamping piece 7. When the heat dissipation assembly 2 is not mounted into the bracket assembly 3, a length of extension of the supporting structure 702 out of the clamping piece 7 is maximum. When the heat dissipation assembly 2 is mounted into the bracket assembly 3, the supporting structure 702 moves close to the clamping piece 7 under an effect of the heat dissipation assembly 2, and may stop moving when the length of the extension of the supporting structure 702 out of the clamping piece 7 is exactly a thickness of the chip 5. In this case, the heat dissipation assembly 2 may be clamped with the clamping surface 30222 under a corresponding step. In addition, a plurality of card fasteners 701 that may be clamped with the substrate 201 may alternatively be disposed on a side of the clamping piece 7 that is used for fastening with the substrate 201, to fasten the clamping piece 7 with the substrate 201.

In this way, when the chip 5 has different thicknesses, the heat dissipation assembly 2 may be enabled to be clamped with the clamping surfaces 30222 under different steps of the hook 30221, to meet requirements of the chips 5 with different thicknesses for a load force, to enable plug connection forces between the chips 5 with different thicknesses and the chip socket 601 to be basically consistent. In this way, compatibility between the bracket assembly 3 and the heat dissipation assembly 2 under different thicknesses of the chip 5 is implemented, so that the heat dissipation apparatus 1 of this application has a relatively broad application scope. The supporting structure 702 may be disposed in different manners. As shown in FIG. 9, a plurality of third mounting holes 703 may be provided in the clamping piece 7. The supporting structure 702 may be mounted in the third mounting holes 703, and may float in a particular range along hole walls of the third mounting holes 703. In this case, the supporting structure 702 may be made of a rigid material. In addition, the supporting structure 702 may alternatively be an elastic supporting member, such as a spring. In this way, a hang hole may be provided in the clamping piece 7, and a hanger may be disposed on the elastic supporting member, so that the elastic supporting member can be hooked on the clamping piece 7. Certainly, other manners that can implement a detachable connection between the supporting structure 702 and the clamping piece 7 may also be used, and are not listed one by one herein.

Figure 11:
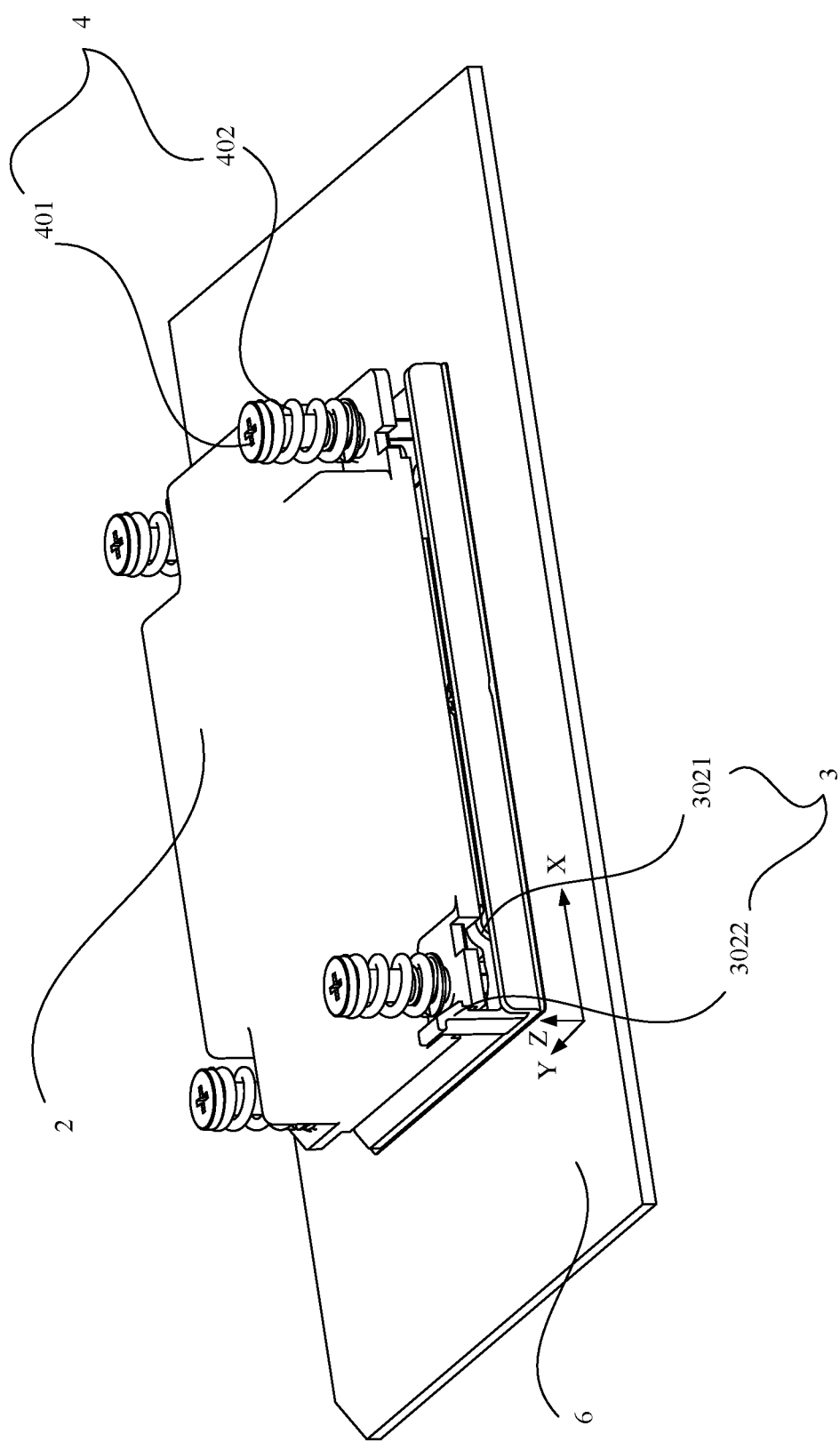
FIG. 11 is a schematic structural diagram of another heat dissipation apparatus according to an embodiment of this application.

In a possible implementation, the chip 5 not only can be fastened on the heat dissipation assembly 2, but also can be fastened on the bracket assembly 3. Refer to FIG. 10 and FIG. 11. When the chip 5 is disposed on the bracket assembly 3, this differs from a setting manner in which the chip 5 is fastened on the heat dissipation assembly 2 in that, the pin of the chip 5 is directly fastened on the PCB 6 in manners such as soldering. As operational performance is greatly improved, power consumption of the chip 5 sharply increases, and heat transfer inside the chip 5 becomes more difficult. In this case, a protective cover plate of the chip 5 needs to be removed to reduce thermal resistance of the chip 5, that is, a bare chip is used. A value of stress that a bare chip can bear greatly decreases relative to a value of stress that a non-bare chip with a protective cover plate can bare. When an external load exceeds a rated load that the bare chip can bear, the bare chip may fail due to excessive stress. Therefore, when the chip 5 is disposed on the bracket assembly 3, the heat dissipation apparatus 1 of some embodiments of this application is used. The fastening force between the heat dissipation assembly 2 and the bracket assembly 3 may be adjusted by using the second elastic structural member 4, so that the heat dissipation assembly 2 applies a load force to the chip 5, thereby dissipating heat for the chip 5. In addition, when the heat dissipation assembly 2 is assembled with the bracket assembly 3, the supporting portion 3021 of the first elastic structural member 302 provides an upward supporting force for the heat dissipation assembly 2. That is, as shown in FIG. 3, the supporting portion 3021 of the first elastic structural member 302 provides an upward supporting force along the Z direction (the Z direction is the direction in which the heat dissipation assembly moves away from the supporting portion) for the heat dissipation assembly 2. Therefore, when the heat dissipation assembly 2 is fastened on the bracket assembly 3 by using the second elastic structural member 4, the heat dissipation assembly 2 can be effectively prevented from generating relatively large inclination, thereby preventing the bare chip from bearing a relatively large instantaneous force, and avoiding damaging the bare chip. Moreover, after the heat dissipation assembly 2 is assembled with the bracket assembly 3, in a dynamic scenario such as packaging, transportation, impact, or bare machine falling, the first elastic structural member 302 can effectively alleviate beating of the heat dissipation assembly 2 on the bare chip, thereby reducing a risk that the bare chip is damaged due to excessive surface stress.

Therefore, the first elastic structural member 302 is disposed on the bracket assembly 3, so that when the heat dissipation assembly 2 is mounted with the bracket assembly 3, the hook 30221 of the connection portion 3022 of the first elastic structural member 302 is clamped with the heat dissipation assembly 3021. Moreover, the supporting portion 301 of the first elastic structural member 302 is compressed under gravity of the heat dissipation assembly 2, to generate the supporting buoyant force for the heat dissipation assembly 2. In this way, when the heat dissipation assembly 2 is fastened on the bracket assembly 3 by using the second elastic structural member 4, the heat dissipation assembly 2 can be effectively prevented from generating relatively large inclination, thereby avoiding damaging the chip 5 due to excessive surface stress. When the heat dissipation assembly 2 is detached from the bracket assembly 3, the heat dissipation assembly 2 may detach from the hook 30221 under the effect of the supporting portion 3021 after clamping between the hook 30221 and the heat dissipation assembly 2 is manually unlocked.

Next, refer to FIG. 1 to FIG. 3. A process in which the heat dissipation assembly 2 is mounted with the bracket assembly 3 and detached from the bracket assembly 3 is described by using an example in which the heat dissipation apparatus includes one heat dissipation assembly and one bracket assembly. In FIG. 2 to FIG. 3, an X direction is a direction in which the connection portion 3022 rebounds, and then a −X direction is a direction in which the hook 30221 moves when the connection portion 3022 deforms. The Z direction is the direction in which the heat dissipation assembly 2 moves away from the bracket assembly 3, and then a direction in which the heat dissipation assembly 2 moves close to the bracket assembly 3 is a direction opposite to the Z direction in the accompanying drawings. The direction may also be marked as a −Z direction. FIG. 2 to FIG. 3 show a process of mounting the heat dissipation assembly 2 and the bracket assembly 3. The heat dissipation assembly 2 is mounted into the bracket assembly 3 along the −Z direction. The connection portion 3022 of the first elastic structural member 302 on the bracket assembly 3 deforms under a pressing effect of the heat dissipation assembly 2. The hook 30221 inclines toward the −direction with the connection portion 3022. After the heat dissipation assembly 2 is mounted into the bracket assembly 3, the hook 30221 rebounds toward the X direction with the connection portion 3022, and is clamped with an edge portion of the heat dissipation assembly 2, to constrain movement of the heat dissipation assembly 2 toward the Z direction. In addition, the supporting portion 3021 of the first elastic structural member 302 generates compression deformation along the −Z direction under the effect of the heat dissipation assembly 2. In this way, the supporting portion 3021 generates a supporting force along the Z direction for the heat dissipation assembly 2. When the heat dissipation apparatus 1 is applied to dissipating heat for the server chip, the PCB 6 is disposed on a side of the bracket assembly 3 that is away from the heat dissipation assembly 2. Regardless of whether the chip 5 is fastened on the heat dissipation assembly 2 or the PCB 6, the heat dissipation assembly 2 is disposed opposite to the chip 5. As shown in FIG. 2, the chip 5 in FIG. 1 is fastened on the heat dissipation assembly 2. In this way, in a dynamic scenario such as falling or impact, movement of the heat dissipation assembly 2 along the −Z direction is constrained under effects of the supporting portion 3021 and the connection portion 3022 of the first elastic structural member 302, to effectively alleviate the beating force of the heat dissipation assembly 2 on the chip socket 601.

In a process of detaching the heat dissipation assembly 2 from the bracket assembly 3 (namely, a process from FIG. 3 to FIG. 2), the clamping between the hook 30221 and the heat dissipation assembly 2 may be manually unlocked. To be specific, the hook 30221 of the first elastic structural member 302 is manually toggled toward the −X direction. In this case, a clamping force between the heat dissipation assembly 2 and the bracket assembly 3 is canceled. The supporting portion 3021 releases a compression force, and provides a force along the Z direction for the heat dissipation assembly 2, to jack up the heat dissipation assembly 2 to detach from the hook 30221. Even if the hook 30221 rebounds along the X direction with the connection portion 3022, the hook 30221 is not clamped with the heat dissipation assembly 2 again. In this case, the heat dissipation assembly 2 may be directly taken out, to implement decoupling of two actions: unlocking the hook 30221 and taking out the heat dissipation assembly 2, to facilitate a one-man operation.

Refer to FIG. 10. When the chip 5 is fastened on the PCB 6, after mounted with the bracket assembly 3, the heat dissipation assembly 2 presses the chip 5 tightly to dissipate heat for the chip 5. In this embodiment, a process in which the heat dissipation assembly 2 is mounted with and detached from the bracket assembly 3 is similar to that in the embodiment in which the chip 5 is fastened on the heat dissipation assembly 2. During specific mounting or detachment, refer to the foregoing steps.

Figure 12:
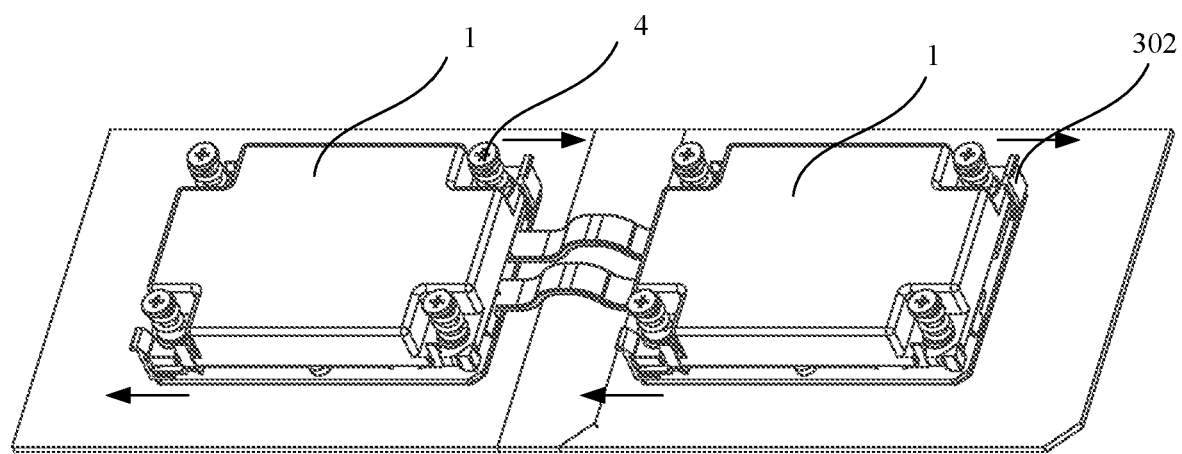
FIG. 12 is a schematic structural diagram of another heat dissipation apparatus according to an embodiment of this application.

Refer to FIG. 12. In a possible embodiment, a conjoined heat dissipation apparatus may also be involved. That is, two heat dissipation assemblies 2 connected to each other are included. Each of the two heat dissipation assemblies 2 is correspondingly mounted into one bracket assembly 3. A manner in which the heat dissipation assembly 2 of the conjoined heat dissipation apparatus is mounted into the bracket assembly 3 is the same as a manner in which a heat dissipation assembly of a single heat dissipation apparatus is mounted into the bracket assembly 3. When the heat dissipation assembly 2 needs to be taken out of the bracket assembly 3, the hook 30221 of the connection portion 3022 only needs to be manually unlocked from the heat dissipation assembly 2 along an arrow direction in the figure. In this case, the heat dissipation assembly 2 pops up under an effect of the supporting portion 3021 of the first elastic structural member 302 and detaches from the hook 30221. After a force of manual unlocking is removed, the heat dissipation assembly 2 is already located above the hook 30221, and the heat dissipation assembly 2 may be directly taken out, to implement decoupling of the two actions: unlocking the hook 30221 and taking out the heat dissipation assembly 2, to facilitate a one-man and one-handed operation of a maintenance engineer.

In the foregoing manner, the first elastic structural member 302 is disposed on the bracket assembly 3, so that when the heat dissipation assembly 2 is mounted with the bracket assembly 3, the hook 30221 of the connection portion 3022 of the first elastic structural member 302 is clamped with the heat dissipation assembly 3021. Moreover, the supporting portion 301 of the first elastic structural member 302 is compressed under gravity of the heat dissipation assembly 2, to generate a supporting effect for the heat dissipation assembly 2. When the heat dissipation assembly 2 is detached from the bracket assembly 3, the heat dissipation assembly 2 may detach from the hook 30221 under the effect of the supporting portion 3021 after clamping between the hook 30221 and the heat dissipation assembly 2 is manually unlocked, to facilitate detaching and mounting of the heat dissipation apparatus 1.

In addition, some embodiments of this application further provide a server. The server includes a chip, and the heat dissipation apparatus according to any one of the foregoing implementations. The heat dissipation assembly of the heat dissipation apparatus is configured to dissipate heat for the chip. The heat dissipation apparatus can enable the chip to have good heat dissipation performance. In addition, in a process in which the heat dissipation assembly is mounted with the bracket assembly, the connection portion of the first elastic structural member may fasten the heat dissipation assembly. Moreover, the supporting portion may provide an upward supporting force for the heat dissipation apparatus. In this way, a force loaded by the heat dissipation assembly to the chip can be effectively prevented from being excessively large, thereby improving maintainability, and also avoiding damaging the chip.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A heat dissipation apparatus, comprising a heat dissipation assembly and a bracket assembly, wherein:
   the heat dissipation assembly comprises a substrate and a heat sink, the heat dissipation assembly is connected to the bracket assembly by using the substrate, and the heat dissipation assembly is configured to dissipate heat for a chip; and
   the bracket assembly comprises a bracket and a plurality of first elastic structural members that are disposed on the bracket, each first elastic structural member comprises a supporting portion and a connection portion, at least one hook is disposed on the connection portion, the connection portion is configured to fasten the heat dissipation assembly by using the at least one hook, the supporting portion is configured to provide an upward supporting force for the heat dissipation assembly, when the heat dissipation assembly is fastened on the bracket assembly, each hook is clamped with the heat dissipation assembly, and the supporting portion generates an upward force under an effect of gravity of the heat dissipation assembly.

2. The heat dissipation apparatus of claim 1, wherein the supporting portion is of a cantilever beam structure with an end fastened to the connection portion, wherein the supporting portion is configured to provide the upward supporting force for the heat dissipation assembly by using the cantilever beam structure, and wherein the upward supporting force is greater than or equal to gravity generated by an area of contact between the heat dissipation assembly and the supporting portion.

3. The heat dissipation apparatus of claim 2, wherein the cantilever beam structure comprises one or more arch structures.

4. The heat dissipation apparatus of claim 1, wherein each hook is clamped with the substrate on a clamping surface, and wherein the clamping surface is horizontally disposed or obliquely disposed.

5. The heat dissipation apparatus of claim 4, wherein an anti-slip structure is disposed on the clamping surface.

6. The heat dissipation apparatus of claim 1, wherein the bracket comprises a rectangular frame body enclosed by a plurality of frame edges, and wherein there are two first elastic structural members separately disposed at vertexes of intersections between a diagonal of the rectangular frame body and the rectangular frame body.

7. The heat dissipation apparatus of claim 1, wherein the heat dissipation assembly further comprises a clamping piece, and wherein the chip is fastened to a side of the substrate that is away from the heat sink.

8. The heat dissipation apparatus of claim 7, wherein the heat dissipation assembly further comprises a supporting structure disposed on the clamping piece, wherein the supporting structure is capable of moving along a direction perpendicular to the clamping piece, and wherein when a length of extension of the supporting structure out of the clamping piece is equal to a thickness of the chip, the supporting structure stops moving.

9. The heat dissipation apparatus of claim 1, wherein the heat dissipation apparatus further comprises a second elastic structural member, wherein the substrate comprises a first mounting hole, wherein the bracket comprises a second mounting hole in one-to-one correspondence with the first mounting hole, and wherein the second elastic structural member sequentially passes through the first mounting hole and the second mounting hole to fasten the heat dissipation assembly on the bracket assembly.

10. The heat dissipation apparatus of claim 9, wherein the second elastic structural member comprises a screw and a spring sleeved over the screw, wherein the first mounting hole is a through hole or a threaded hole, and wherein the second mounting hole is a threaded hole.

11. The heat dissipation apparatus according to claim 1, wherein the substrate comprises a clamping slot, and wherein the hook is clamped with the clamping slot.

12. The heat dissipation apparatus of claim 1, wherein the first elastic structural member is of an integral structure.

13. The heat dissipation apparatus of claim 12, wherein a material of the first elastic structural member is plastic or steel.

14. A server, comprising a chip and a heat dissipation apparatus, wherein the heat dissipation apparatus comprising a heat dissipation assembly and a bracket assembly, and wherein:
   the heat dissipation assembly comprises a substrate and a heat sink, the heat dissipation assembly is connected to the bracket assembly by using the substrate, and the heat dissipation assembly is configured to dissipate heat for the chip; and
   the bracket assembly comprises a bracket and a plurality of first elastic structural members that are disposed on the bracket, each first elastic structural member comprises a supporting portion and a connection portion, at least one hook is disposed on the connection portion, the connection portion is configured to fasten the heat dissipation assembly by using the at least one hook, the supporting portion is configured to provide an upward supporting force for the heat dissipation assembly, when the heat dissipation assembly is fastened on the bracket assembly, each hook is clamped with the heat dissipation assembly, and the supporting portion generates an upward force under an effect of gravity of the heat dissipation assembly.

15. The server of claim 14, wherein the supporting portion is of a cantilever beam structure with an end fastened to the connection portion, wherein the supporting portion is configured to provide the upward supporting force for the heat dissipation assembly by using the cantilever beam structure, and wherein the upward supporting force is greater than or equal to gravity generated by an area of contact between the heat dissipation assembly and the supporting portion.

16. The server of claim 15, wherein the cantilever beam structure comprises one or more arch structures.

17. The server of claim 14, wherein each hook is clamped with the substrate on a clamping surface, and wherein the clamping surface is horizontally disposed or obliquely disposed.

18. The server of claim 17, wherein an anti-slip structure is disposed on the clamping surface.

19. The server of claim 14, wherein the bracket comprises a rectangular frame body enclosed by a plurality of frame edges, and wherein there are two first elastic structural members separately disposed at vertexes of intersections between a diagonal of the rectangular frame body and the rectangular frame body.

20. The server of claim 14, wherein the heat dissipation assembly further comprises a clamping piece, and wherein the chip is fastened to a side of the substrate that is away from the heat sink.

* * * * *